Nov. 21, 1950 R. P. MOORE, JR 2,531,076

BISTABLE SEMICONDUCTOR MULTIVIBRATOR CIRCUIT

Filed Oct. 22, 1949 2 Sheets-Sheet 1

Inventor
Raymond P. Moore, Jr.

By H. L. Newton

Attorney

Nov. 21, 1950 R. P. MOORE, JR 2,531,076

BISTABLE SEMICONDUCTOR MULTIVIBRATOR CIRCUIT

Filed Oct. 22, 1949 2 Sheets-Sheet 2

Inventor

Raymond P. Moore, Jr.

By

Attorney

Patented Nov. 21, 1950 2,531,076

UNITED STATES PATENT OFFICE 2,531,076

BISTABLE SEMICONDUCTOR MULTIVIBRATOR CIRCUIT

Raymond P. Moore, Jr., West Collingswood, N. J., assignor to Radio Corporation of America, a corporation of Delaware Application October 22, 1949, Serial No. 123,076

7 Claims. (Cl. 171—97)

This invention relates generally to relaxation oscillators, and more particularly relates to a bistable multivibrator of the type including two semi-conductor devices.

In a copending application of E. Eberhard, Serial No. 121,552, filed on October 15, 1949, and assigned to the assignee of this application, various multivibrator circuits have been disclosed which make use of semi-conductor devices. Among the multivibrator circuits disclosed in the Eberhard application is a bistable multivibrator, that is, a multivibrator which has two stable states of operation. Thus, a bistable multivibrator may be triggered alternately from one stable state of operation to the other by the application of triggering impulses. A multivibrator circuit of this type is also known as a flip-flop circuit or as a multivibator of the Eccles-Jordan type. A bistable multivibrator circuit finds application, for example, in counter circuits where it is desired to count impulses occurring either at regular intervals or at random. A circuit of this type must be stable. Furthermore, the ease with which the trigger pulses may be applied is an important consideration for such counter circuits. In the Eberhard multivibrator, the trigger pulses must be applied simultaneously to corresponding electrodes of the two-semi-conductor devices of the circuit. For a cascade-connected counter it is usually desirable to apply the trigger pulses to a single electrode only.

It is accordingly a principal object of the present invention to provide an improved bistable multivibrator circuit including two semi-conductor devices.

Another object of the invention is to provide a bistable multivibrator circuit of the type referred to which will be more stable than previous multivibrator circuits of the semi-conductor types.

A further object of the invention is to provide a bistable multivibrator circuit which may be triggered by input pulses of either polarity or by pulses of mixed polarity impressed on one electrode only of one of the two semi-conductor devices of the circuit, thereby to render the circuit more adapted for use in a multi-stage impulse counter.

A bistable multivibrator circuit in accordance with the invention comprises two semi-conductor devices each having a base electrode, an emitter electrode and a collector electrode in contact with a semi-conducting body. Individual resistors are provided in circuit with each of the electrodes of the two devices and energizing potentials are applied to the electrodes, as is conventional. Furthermore, the base electrode of each device is cross connected to the collector electrode of the other device by an impedance element, such as a resistor, so that the circuit will have two stable states of operation. Thus, when one device is in a state of high conduction, the other device will be in a state of low conduction. The two resistors which cross-connect the base electrode of one device to the collector electrode of the other device aid to maintain the circuit in either one of its stable states.

In accordance with the present invention, the two emitter electrodes are interconnected or coupled by an impedance element, such as a capacitor. This capacitor renders the circuit more stable and aids in the rapid transfer of the condition of high conductivity from one device to the other device upon the arrival of a trigger pulse. The trigger pulses may either be of positive or of negative polarity or of mixed polarity and preferably are applied to the base electrode of the first device while the output pulses are preferably derived from the collector electrode of the second device. No change in bias is required to make multivibrator circuit responsive to pulses of either polarity.

The novel features that are considered characteristic of this invention are set forth with particularity in the appended claims. The invention itself, however, both as to its organization and method of operation, as well as additional objects and advantages thereof will best be understood from the following description when read in connection with the drawing, in which:

Figure 1:
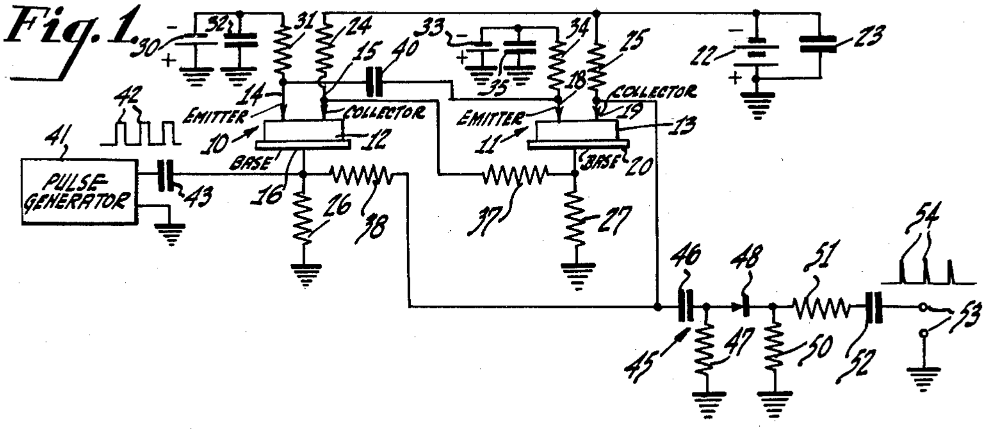
Figure 1 is a circuit diagram of a bistable multivibrator circuit embodying the present invention.

Referring now to the drawings, in which like components have been designated by the same reference numerals throughout the figures, and particularly to Figure 1, there is illustrated a bistable multivibrator circuit in accordance with the invention comprising a first semi-conductor device 10 and a second semi-conductor device 11. The first semi-conductor device 10 includes body 12 of semi-conducting material which may consist, for example, of boron, silicon, germanium, tellurium or selenium containing a small but sufficient number of atomic impurity centers or lattice imperfections as commonly employed for best results in crystal rectifiers. Germanium is the preferred material for body 12 and may be prepared so as to be an electronic N type semi-conductor, as is well known.

The surface of semi-conducting body 12 may be polished and etched in a conventional manner. It is also feasible to utilize the germanium block of a commercial high-back-voltage germanium rectifier such as the type 1N34, in which case further surface treatment may not be required. It is also feasible to treat body 12 in the manner disclosed and claimed in the copending application to Barton, Serial No. 118,428, filed on September 28, 1949, and assigned to the assignee of this application. Body 13 of the second semiconductor device 11 may consist of the same material as does body 12 and may be treated in the same manner.

Semi-conducting body 12 of semi-conductor device 10 is provided with emitter electrode 14, collector electrode 15 and base electrode 16. Emitter electrode 14 and collector electrode 15 are usually small-area electrodes and may be point contacts consisting, for example, of tungsten or Phosphor bronze wires having a diameter of the order of 2 to 5 mils with a pointed tip. However, it is not essential that emitter electrode 14 and collector electrode 15 are small-area electrodes provided they make rectifying, high-resistance contacts with body 12. Emitter and collector electrodes 14 and 15 are ordinarily placed closely adjacent to each other on the same surface of body 12 or on opposite surfaces thereof, in which case they may be separated by a distance of from 2 to 5 mils.

Base electrode 16 provides a low-resistance, non-rectifying contact with the bulk material of semi-conducting body 12 and usually is a large-area electrode. Similarly, the second semi-conductor device 11 is provided with emitter electrode 18, collector electrode 19 and base electrode 20 which may be constructed and arranged in the same manner as the corresponding electrodes of device 10.

A comparatively large, reverse bias voltage is impressed between associated collector and base electrodes. Thus, assuming that bodies 12 and 13 consist of N type germanium which is presumed to have a P type surface layer, the collector electrodes must be biased negatively with respect to their associated base electrodes. To this end, there is provided battery 22 having its positive terminal grounded and by-passed for alternating-frequency currents by capacitor 23. The negative terminal of battery 22 is connected to collector electrode 15 through resistor 24 and also to collector electrode 19 through resistor 25. Resistors 26 and 27 individually connect base electrodes 16 and 20, respectively, to ground.

A comparatively small forward bias is provided between the emitter electrodes and their associated base electrodes. Assuming again that bodies 12 and 13 consist of N type germanium which is assumed to have a P type surface layer, the emitter electrodes must normally have a positive potential with respect to their associated base electrodes. To this end separate bias batteries may be provided for devices 10 and 11. Since base electrode 16 normally has a negative potential with respect to ground due to the voltage drop across resistor 26 battery 30 has its positive terminal grounded while its negative terminal is connected to emitter electrode 14 through resistor 31. Battery 30 may be shunted by by-pass capacitor 32. Another battery 33 is provided for biasing emitter electrode 18 in a similar manner and has its positive terminal grounded while its negative terminal is connected to emitter electrode 18 through resistor 34. Capacitor 35 by-passes battery 33 for alternating-frequency currents.

Resistor 37 is connected between collector electrode 15 of device 10 and base electrode 20 of device 11. Similarly, resistor 38 is connected between collector electrode 19 of device 11 and base electrode 16 of device 10. In accordance with the present invention capacitor 40 interconnects the two emitter electrodes 14 and 18.

Trigger pulses developed by pulse generator 41 and illustrated at 42 may be applied across base resistor 26 by coupling capacitor 43. The trigger pulses illustrated at 42 are of positive polarity, but it is to be understood that the circuit may also be triggered by the application of negative trigger pulses. The out put pulses or square topped waves are derived from collector electrode 19. Preferably the output pulses are differentiated by differentiating network 45 including capacitor 46 connected to collector electrode 19 and shunt resistor 47 having one terminal grounded.

The output pulses derived from differentiating network 45 may be applied to a second counter stage similar to the one shown in Figure 1. In this case, it is desirable to remove the pulses of undesired polarity obtained from differentiating network 45. The desired pulses may, for example, be of positive polarity. Thus, the pulses of positive and negative polarity derived from network 45 may be applied to a crystal rectifier 48 which functions as a clipper and removes the negative pulses. The direct current return path of the clipper circuit is completed by shunt resistors 47 and 50 each having one terminal grounded. The pulses are derived across resistor 50 and may be impressed on another counter stage through series resistor 51 and blocking capacitor 52 and may be obtained from output terminals 53. The positive output pulses are shown at 54. It is to be understood that differentiating network 45 includes the shunt resistance represented by resistor 50 and by any shunt resistance which may exist in output terminals 53.

Figure 2:
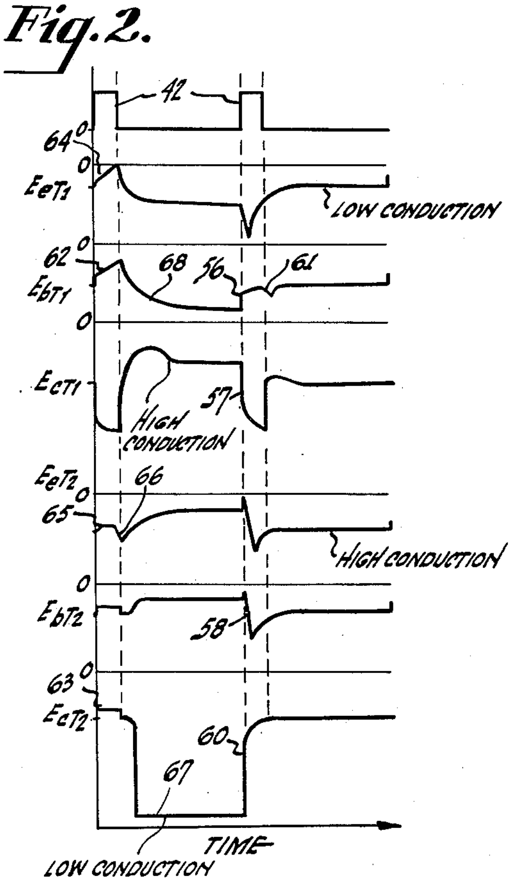
Figure 2 is a graph illustrating the voltages at the electrodes of two semi-conductor devices of the circuit of Figure 1.

The operation of the multivibrator circuit of Figure 1 will be better understood by reference to Figure 2. In Figure 2 $E_{eT1}$, $E_{bT1}$, $E_{cT1}$, $E_{eT2}$, $E_{bT2}$ and $E_{cT2}$ indicate respectively the voltages of emitter electrode 14, base electrode 16 and collector electrode 15 of the first device 10 and of emitter electrode 18, base electrode 20 and collector electrode 19 of the second device 11 with respect to time.

Let it now be assumed that device 10 conducts current heavily while device 11 conducts current lightly. Upon the arrival of a positive trigger pulse 42, the voltage of base electrode 16 goes in a positive direction as shown by curve portion 56 (Figure 2). This in turn will cut off the current conduction through device 10 because the voltage between emitter electrode 14 and base electrode 16 becomes too small to permit the flow of current. Since current no longer flows through collector resistor 24, the voltage of collector electrode 15 goes in a negative direction as shown by curve portion 57 (Figure 2). Accordingly, the voltage of base electrode 20 also goes in a negative direction because collector electrode 15 and base electrode 20 are coupled through resistor 37. This is illustrated by curve portion 58 of Figure 2. As soon as the voltage of base electrode 20 becomes more negative, device 11 will conduct more current and accordingly the voltage of collector electrode 19 becomes more positive due to the voltage drop across collector resistor 25 as illustrated by curve portion 60. This positive going collector voltage is now impressed through coupling resistor 38 on base electrode 16, which in turn becomes still more positive. Thus, the feedback path is regenerative and the current conduction through device 10 is consequently cut off very quickly while the current through device 11 increases rapidly.

Upon the arrival of the trailing edge of the input pulse 42, base electrode 16 becomes slightly more negative as indicated at 61 in Figure 2. This in turn will permit device 10 to conduct a small amount of current. A new stable state of operation has now been reached will continue until the arrival of the next trigger pulse 42. Device 10 is now in a state of low conduction while device 11 is in a state of heavy conduction.

Upon the arrival of the next trigger pulse 42, the potential of base electrode 16 again becomes more positive as illustrated at 62. However, the positive trigger pulse will have little effect on device 10 which is already in a state of low current conduction. This positive trigger pulse is now applied through coupling resistor 38 to collector electrode 19, the voltage of which will rise in a positive direction as indicated at 63 in Figure 2. This rise of voltage of collector electrode 19 cuts off device 11 because the potential between collector electrode 19 and its base electrode 20 is slightly reduced.

The trigger action is further facilitated by the provision of coupling capacitor 40. The arrival of the positive trigger pulse 42 will also increase the potential of the emitter electrode 14 in a positive direction as shown by curve portion 64. This positive going pulse appearing on emitter electrode 14 is now impressed through coupling capacitor 40 on emitter electrode 18 as shown by curve portion 65. The voltage of emitter electrode 18 is now more positive. Capacitor 40 and resistor 34 have such circuit constants as to function as a differentiator network for the pulse 64 appearing on emitter electrode 14.

The trailing edge of the positive pulse 64 on emitter electrode 14 is caused by the trailing edge of trigger pulse 42 and is differentiated and applied to emitter electrode 18. Consequently, the voltage of emitter electrode 18 drops as shown by curve portion 66. This in turn tends to cut off device 11 due to the reduced potential between emitter electrode 18 and base electrode 20. Thus, device 11 is cut off by the trailing edge of trigger pulse 42 and the voltage of collector electrode 19 becomes quite negative as shown by curve portion 67. This in turn causes a drop of the voltage of base electrode 16 as shown by curve portion 68.

It is to be understood that it is essential for the operation of the multivibrator circuit of the invention that at this point of the operating cycle, device 10 conducts a certain amount of current. Only under those circumstances will a positive going pulse appear on emitter electrode 14 which is then differentiated and applied to emitter electrode 18.

The multivibrator circuit is now again in tis original state of stable operation in which it will continue until the arrival of the next trigger pulse whereupon the cycle of operation will repeat. As clearly shown in Figure 2, a substantially square wave 60, 67 is developed at collector electrode 19 which may be differentiated by differentiating network 45 and passed through a clipper or crystal rectifier 48 so that positive output pulses 54 may be obtained from output terminals 53. It will, of course, be understood that one output pulse is obtained for every pair of trigger pulses. The multivibrator circuit of Figure 1 may be triggered by the application of trigger pulses to base electrode 16, and it is not necessary to apply the trigger pulses to corresponding electrodes of devices 10 and 11 simultaneously.

Preferably, the resistance of base resistor 26 is larger than the resistance of base resistor 27. Furthermore, the resistance of coupling resistor 38 is preferably smaller than the resistance of coupling resistor 37. Consequently, a large trigger pulse is developed across base resistor 26 which is impressed through coupling resistor 38 on collector electrode 19, thereby to facilitate the transfer of the trigger pulses to collector electrode 19. The multivibrator circuit of Figure 1 is accordingly unsymmetrical. It will also be understood that coupling capacitor 40 may be omitted in which case the circuit will operate as described provided the resistance of resistor 26, 27 and 37, 38 have the relative values indicated above. However, the circuit without capacitor 40 will be less stable.

It has been found that it is also feasible to trigger the multivibrator circuit of Figure 1 by the application of negative trigger pulses to base electrode 16. Thus, when device 10 is conducting lightly while device 11 is conducting heavily, a negative trigger pulse will drive device 10 into its heavy current conduction state as will be evident. On the other hand, when device 10 is conducting heavily while device 11 conducts lightly, the arrival of a negative trigger pulse will have little effect on device 10, but the negative trigger pulse also appears on collector electrode 19 thus increasing the current flow through device 11 which in turn will cut off device 10. Capacitor 40 acts again in a manner similar to that previously described. Thus, the negative trigger pulse will appear on emitter electrode 14. The trailing edge of the trigger pulse is differentiated by capacitor 40 and resistor 34 and impressed on the emitter electrode 18 as a positive pulse which further increases the current flow through device 11.

Figure 3:
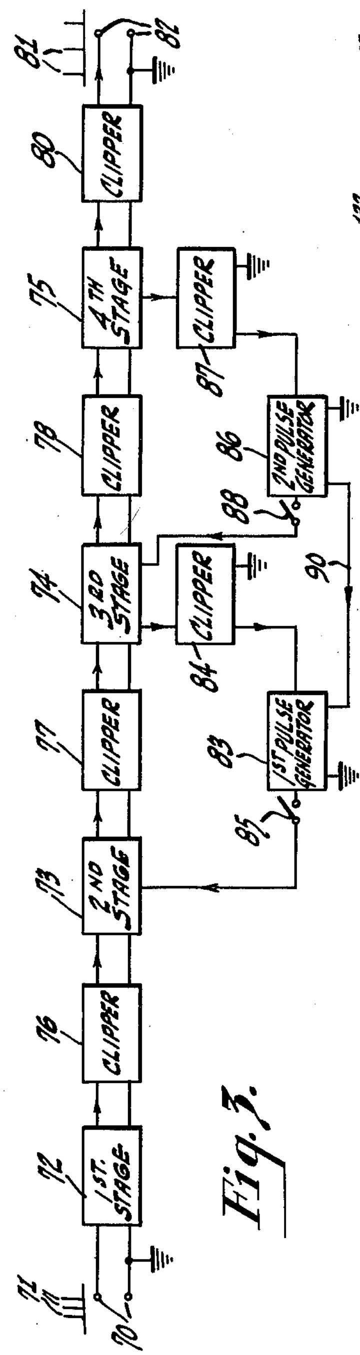
Figure 3 is a block diagram of a multi-stage impulse counter for developing one output pulse in response to a certain number of input pulses, and which may function as a decade counter, being one illustration of a counter embodying the circuit of the invention.

The multivibrator circuit of Figure 1 may, for example, be used in a multi-stage impulse counter of the type illustrated schematically in Figure 3. The impulse counter of Figure 3 has a pair of input terminals 70 on which trigger pulses 71 of either positive polarity as illustrated or of negative polarity may be impressed. The impulse counter includes four stages 72, 73, 74 and 75 connected in cascade. Individual clipper stages 76, 77, 78 and 80 are connected to the output of each counter stage. Each clipper stage may include a crystal rectifier such as shown in Figure 1. Positive output pulses 81 may be obtained from output terminals 82.

The first two counter stages 72 and 73 may be identical with the multivibrator circuit of Figure 1 as will be fully explained in connection with Figure 4. The second two counter stages 74 and 75 may, for example, consist of the flip-flop circuit disclosed and claimed in a copending application of E. Eberhard Serial No. 90,685, filed on April 30, 1949, and assigned to the assignee of this application. However, it is to be understood that stages 72, 73 and stages 74, 75 may be exchanged or that all four stages may be identical.

The impulse counter as described will operate in a conventional manner and each stage will develop one output pulse in response to two input pulses. Consequently, the entire counter of Figure 3 will develop one output pulse for 24 or 16 input pulses. However, it is also feasible to arrange the impulse counter of Figure 3 as a decade counter so that one output pulse is developed in response to every 10 input pulses. To this end, there may be provided a first pulse generator 83 connected through clipper 84 to the output of the third counter stage 74. The output signal of pulse generator 83 may be impressed through switch 85 on the second counter stage 73. Furthermore, a second pulse generator 86 is connected through clipper 84 to the output of the fourth counter stage 75. The output signal developed by the second pulse generator 86 is connected through switch 88 to the third counter stage 74 and also through lead 90 to the first pulse generator 83.

Pulse generators 83 and 86 preferably consist of a relaxation oscillator of the type disclosed and claimed in a copending application to E. Eberhard, Serial No. 70,661, filed on January 4, 1949, and assigned to the assignee of this application.

When switches 85 and 88 are closed, the impulse counter of Figure 3 functions as a decade counter and its operation will now be explained by reference to Figure 5.

Figure 5:
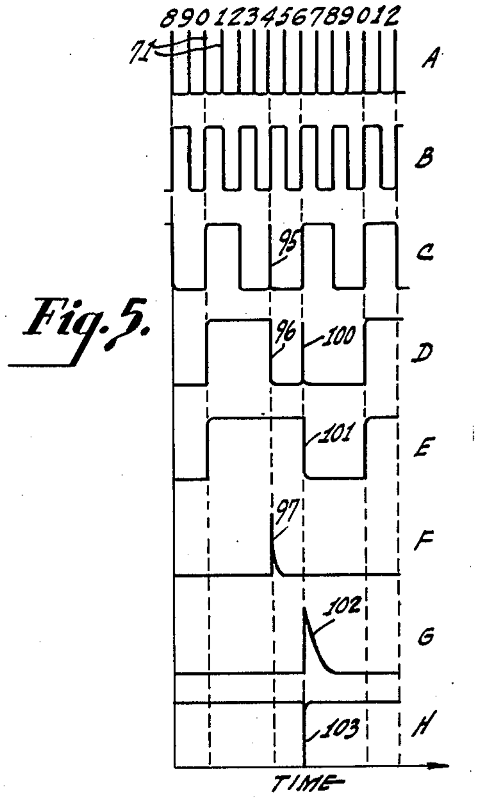
Figure 5 is a graph illustrating the pulses developed at the various stages of the counter of Figure 4.

In Figure 5 to which reference is now made the input pulses 71 have been indicated at A. The pulses or square-topped waves shown at B, C, D and E indicate respectively the waves derived from the collector electrodes of the first stage 72, the second stage 73, the third stage 74 and the fourth stage 75. The pulses shown at F and G indicate the output waves derived from the first pulse generator 83 and from the second pulse generator 86. The wave shown at H indicates the pulse which is impressed through lead 90 from the second pulse generator 86 on the first pulse generator 83.

An inspection of the wave shapes shown at B indicates that on the occurrence of every even trigger pulse 71 a positive going pulse is developed by the first stage 72 which is terminated upon the arrival of the succeeding odd trigger pulse. Accordingly, the second stage 73 receives an input pulse corresponding to the arrival of each leading edge of a pulse of wave B. However, a sharp pulse 95 occurs in wave C on the arrival of the fourth trigger pulse. This pulse is caused by the first pulse generator 83 which is triggered by the negative going or trailing edge 96 of wave D which is developed by the third stage 74. This trailing edge 96 triggers pulse generator 83 to develop a sharp positive pulse 96 (shown at F) which is impressed on the second stage 73. Accordingly, pulse 97 immediately triggers the second stage 73 back into its original position, and the second stage 73 is now ready to be triggered again on the occurrence of the 6th input pulse.

It will be observed that wave D also includes a sharp pulse 100 which occurs on the arrival of the 6th trigger pulse. This sharp pulse 100 is due to the provision of the second pulse generator 86 which is coupled to the output of the fourth stage 75. Pulse generator 86 is responsive to the negative going or trailing edge 101 of wave E and develops a positive pulse 102 in response thereto. This positive pulse 102 triggers the third stage 74 back into its original state thereby producing the sharp pulse 100. The third stage accordingly responds again to the arrival of the tenth output pulse.

It is essential that improper operation of the impulse counter of Figure 3 be prevented. Thus, the sharp pulse 100 represents a positive going transition which is immediately followed by a negative going transition. However, the negative going transititon of the output pulse of stage 74 may tend to fire the first pulse generator 83 which is coupled thereto, thus producing a pulse on wave F in synchronism with the sixth trigger pulse. In order to prevent this, the differentiating circuit provided between the third stage 74 and the first pulse generator 83, which develops negative pulses to trigger the pulse generator, has a sufficiently long time constant so that it will not respond to the very narrow pulse 100. In addition a negative blanking pulse 103 indicated in line H is derived from the second pulse generator 86 and applied to the first pulse generator 83 so as to oppose any residual trigger pulse and to insure that pulse generator 83 is not triggered upon the arrival of the sixth trigger pulse.

Figure 4:
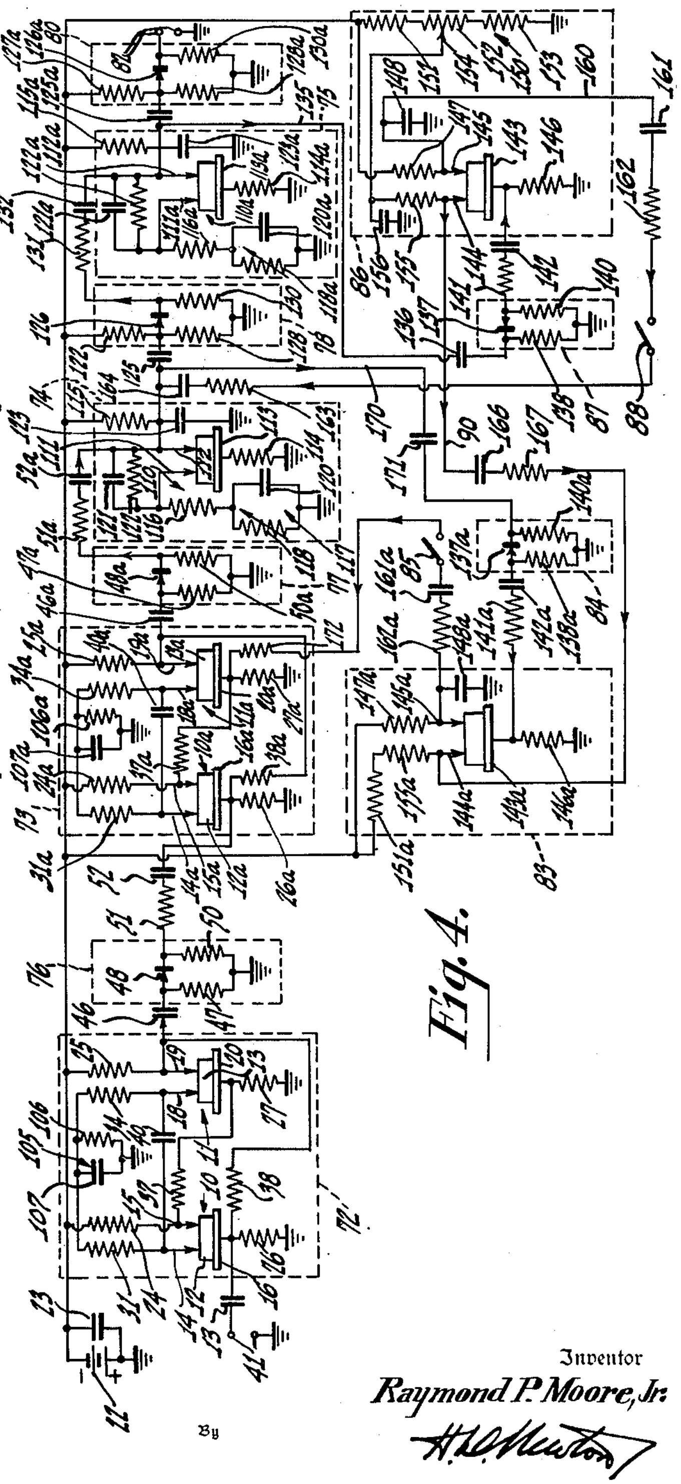
Figure 4 is a detailed circuit diagram of the impulse counter of Figure 3.

Referring now to Figure 4, there is illustrated a detailed circuit diagram of the impulse counter of Figure 3. The first counter stage 72 is substantially identical with the bistable multivibrator of Figure 1. However, the two emitter electrodes 14 and 18 are provided with a common bias network 105, as is conventional. Network 105 consists of resistor 106 shunted by capacitor 107 and connected between ground on the one hand and emitter resistors 31 and 34, on the other hand. A common collector voltage supply 22 shunted by capacitor 23 is provided for all counter stages and pulse generators.

Since counter stage 72 operates in the same manner as the multivibrator of Figure 1 a further explanation of its operation is unnecessary here. The output signal is derived from collector electrode 19 and is passed through clipper 76 which is identical with the clipper circuit illustrated in Figure 1. Capacitor 46 and resistor 47 again function as a differentiating network. Accordingly, the differentiated and clipped pulses derived from stage 72 are impressed through resistor 51 and capacitor 52 connected in series on the base electrode $16a$ of the next counter stage 73. Stages 72 and 73 are identical so that further explanation of the second stage is not necessary here. Corresponding circuit elements and parts of stage 73 have been given the same reference numerals as were used in stage 72 except that each numeral has been provided with the affix A. The output pulse derived from the second stage 72 is again differentiated and clipped by clipper 77 and impressed on the third stage 74.

The third stage 74 is a flip-flop circuit which may be considered a bistable multivibrator, that is, a circuit having two stable states of operation. However, the flip-flop circuit of stage 74 includes but a single semi-conductor device 110 having an emitter electrode 111, a collector electrode 112 and a base electrode 113. The base electrode 113 is grounded through a resistor 114. Collector electrode 112 is connected to the negative terminal of battery 22 through resistor 115. Emitter electrode 111 is grounded through resistor 116 and bias network 117 including variable resistor 118 shunted by capacitor 120. Emitter electrode 111 and collector electrode 112 are interconnected by capacitor 121 and resistor 122. Collector electrode 112 is grounded through capacitor 123. The positive trigger pulses obtained from clipper 77 are impressed on collector electrode 112 through resistor 51*a* and capacitor 52*a* connected in series.

The operation of the flip-flop circuit 74 has been fully explained in the copending application to Eberhard, Serial No. 90,685 above referred to. The circuit 74 is arranged to have two stable states of operation, one corresponding to a low conduction state and one corresponding to a high conduction state. This is obtained by the provision of base resistor 114 and coupling resistor 122. Upon the arrival of a trigger pulse impressed on collector electrode 112 the circuit is triggered from low to high conduction. The circuit is triggered again by the arrival of a succeeding trigger pulse, from high to low conduction. Consequently, the collector voltage becomes still more positive and due to the provision of capacitor 123 the circuit cannot lock again in its high conduction state and thus returns to its low conduction state.

The output pulses are obtained from collector electrode 112 and are fed through differentiating capacitor 125 to clipper 78. Clipper 78 includes crystal rectifier 126, the input electrode of which is maintained at a predetermined negative potential by resistors 127 and 128 connected serially between battery 22 and ground. The bias voltage of rectifier 126 prevents the positive pulses from stage 73 appearing on collector electrode 112 from being passed by the rectifier. Resistor 130 completes the direct current return path of the rectifier. Clipper 78 accordingly passes only positive pulses which have been differentiated by capacitor 125 and resistor 128 and which have an amplitude exceeding the bias voltage of the rectifier. It is to be understood that clippers 76 and 77 may be biased in the manner just described in connection with clipper 78. The thus obtained output pulses are fed through resistor 131 and capacitor 132 to collector electrode 112*a* of the last or fourth stage 75, which is identical with stage 74. Corresponding elements and parts of circuit 75 have been given the same reference numerals as have been used in stage 74 except that they have been provided with an affix *a*.

The output pulses derived from the fourth stage 75 are again passed through clipper 80 which is identical with clipper 78, and the output pulses of the last stage may be derived from output terminals 82.

As indicated in Figure 3, the second pulse generator 86 is coupled through clipper 87 to the fourth counter stage 75. Thus lead 135 is connected to collector electrode 112*a* of the fourth stage 75 and is coupled through coupling capacitor 136 to clipper 87. Clipper 87 includes crystal rectifier 137 having both electrodes grounded through resistors 138 and 140. It will be observed that rectifier 137 is inverted with respect to the rectifiers of clippers 78 or 80 and accordingly a negative pulse is derived from clipper 87 which is impressed through resistor 141 and capacitor 142 on base electrode 143 of pulse generator 86.

Pulse generator 86 further includes emitter electrode 144 and collector electrode 145. Base electrode 143 is grounded through resistor 146. Collector electrode 145 is connected to battery 22 through resistor 147. Furthermore, collector electrode 145 is grounded through capacitor 148. The bias voltage for emitter electrode 144 is obtained from voltage divider 150 including resistors 151, 152 and 153 connected between battery 22 and ground. The emitter bias voltage is derived from variable tap 154 on resistor 152. Resistor 155 is connected between variable tap 152 and emitter electrode 144. Capacitor 156 is connected between variable tap 154 and ground for bypassing alternating-frequency currents.

Pulse generator 86 is a relaxation oscillator of the type disclosed and claimed in the Eberhard application, Serial No. 70,661 above referred to. Its operation has been explained in a paper by Webster, Eberhard, and Barton which appears in the March 1949 issue of RCA Review on pages 5 to 16 (see particularly pages 14 to 16).

The relaxation oscillator or pulse generator 86 is triggered by a negative pulse applied to its base electrode 143. Output pulses may be derived from collector electrode 145 through lead 160, which interconnects collector electrode 145 with collector electrode 112 of the third counter stage 74 through capacitor 161, resistor 162, switch 88, resistor 163 and capacitor 164. Accordingly, counter stage 74 is triggered by the pulses developed by the generator 86. Furthermore, another output pulse may be derived from emitter electrode 144 through lead 90. This pulse is utilized for the purpose explained hereinbefore and may be impressed through capacitor 166 and resistor 167 on emitter electrode 144*a* of the first pulse generator 83 which may be identical with the second pulse generator 86. Corresponding parts have been designated with the same reference numerals except that those for pulse generator 83 bear the affix *a*. Pulse generator 83 is triggered from the output pulses derived from the third stage 74. To this end lead 170 connects collector electrode 112 through coupling capacitor 171 to clipper 84, which is identical with clipper 87. Accordingly, negative pulses are obtained from clipper 84 and impressed through capacitor 142*a* and resistor 141*a* on base electrode 143*a* of pulse generator 83. The output pulses are obtained from collector electrode 145*a* of pulse generator 83 and are impressed through resistor 162*a*, capacitor 161*a*, switch 85 and resistor 172 to base electrode 20*a* of counter stage 73.

It is believed that the operation of the impulse counter of Figure 4 will now be obvious in view of the previous explanations.

While it will be understood that the circuit specifications of the impulse counter of Figure 4 may vary according to the design for any particular application, the following circuit specifications are included by way of example only:

| | | | |
|---|---|---|---|
| Voltage of battery 22 | | volts | −45 |
| *First stage 72* | | | |
| Resistor | 26 | ohms | 10,000 |
| Resistor | 31 | do | 5,600 |
| Resistor | 24 | do | 10,000 |
| Resistor | 106 | do | 1,800 |
| Resistor | 34 | do | 2,200 |
| Resistor | 25 | do | 10,000 |
| Resistor | 27 | do | 2,700 |
| Resistor | 37 | do | 56,000 |
| Resistor | 38 | do | 15,000 |
| Capacitor | 43 | microfarads | .1 |
| Capacitor | 40 | do | .001 |
| Capacitor | 107 | do | 25 |
| Capacitor | 46 | micromicrofarads | 820 |
| *Clipper 76* | | | |
| Resistor | 47 | ohms | 82,000 |
| Resistor | 50 | do | 39,000 |
| Resistor | 51 | do | 5,600 |
| Capacitor | 52 | microfarads | .01 |

*Second stage 73*

| | | | |
|---|---|---|---|
| Resistor | 26a | ohms | 1,800 |
| Resistor | 31a | do | 2,700 |
| Resistor | 106a | do | 390 |
| Resistor | 34a | do | 560 |
| Resistor | 24a | do | 22,000 |
| Resistor | 25a | do | 10,000 |
| Resistor | 37a | do | 39,000 |
| Resistor | 38a | do | 2,200 |
| Resistor | 27a | do | 2,200 |
| Capacitor | 40a | microfarads | .001 |
| Capacitor | 107a | do | .1 |
| Capacitor | 46a | micromicrofarads | 820 |

*Clipper 77*

| | | | |
|---|---|---|---|
| Resistor | 47a | ohms | 82,000 |
| Resistor | 50a | do | 39,000 |
| Resistor | 51a | do | 1,000 |
| Capacitor | 52a | micromicrofarads | 680 |

*Third stage 74*

| | | | |
|---|---|---|---|
| Resistor | 114 | ohms | 6,800 |
| Resistor | 116 | do | 1,800 |
| Resistor | 118 | do | 2,500 |
| Resistor | 122 | do | 22,000 |
| Resistor | 115 | do | 15,000 |
| Capacitor | 120 | microfarads | 25 |
| Capacitor | 121 | micromicrofarads | 330 |
| Capacitor | 123 | do | 560 |
| Capacitor | 125 | do | 820 |

*Clipper 78*

| | | | |
|---|---|---|---|
| Resistor | 127 | ohms | 1,800,000 |
| Resistor | 128 | do | 82,000 |
| Resistor | 130 | do | 39,000 |
| Resistor | 131 | do | 470 |
| Capacitor | 132 | micromicrofarads | 680 |

*Fourth stage 75*

| | | | |
|---|---|---|---|
| Resistor | 114a | ohms | 8,200 |
| Resistor | 116a | do | 1,800 |
| Resistor | 118a | do | 2,500 |
| Resistor | 122a | do | 22,000 |
| Resistor | 115a | do | 27,000 |
| Capacitor | 120a | microfarads | 25 |
| Capacitor | 121a | micromicrofarads | 330 |
| Capacitor | 123a | do | 560 |
| Capacitor | 125a | do | 820 |

*Clipper 80*

| | | | |
|---|---|---|---|
| Resistor | 127a | ohms | 1,500,000 |
| Resistor | 128a | do | 82,000 |
| Resistor | 130a | do | 1,000 |

*Clipper 87*

| | | | |
|---|---|---|---|
| Capacitor | 136 | micromicrofarads | 680 |
| Resistor | 138 | ohms | 82,000 |
| Resistor | 140 | do | 39,000 |
| Resistor | 141 | do | 560 |
| Capacitor | 142 | microfarads | .01 |

*Second pulse generator 86*

| | | | |
|---|---|---|---|
| Resistor | 146 | ohms | 10,000 |
| Resistor | 147 | do | 33,000 |
| Resistor | 151 | do | 82,000 |
| Resistor | 152 | do | 5,000 |
| Resistor | 153 | do | 8,200 |
| Resistor | 155 | do | 820 |
| Capacitor | 156 | microfarads | .1 |
| Capacitor | 148 | do | .001 |
| Capacitor | 161 | do | .1 |
| Resistor | 162 | ohms | 1,500 |
| Resistor | 163 | do | 1,500 |
| Capacitor | 164 | microfarads | .001 |
| Capacitor | 166 | do | .01 |
| Resistor | 167 | ohms | 10,000 |

*Clipper 84*

| | | | |
|---|---|---|---|
| Capacitor | 171 | micromicrofarads | 680 |
| Resistor | 140a | ohms | 82,000 |
| Resistor | 138a | do | 39,000 |
| Capacitor | 142a | microfarads | .01 |
| Resistor | 141a | ohms | 470 |

*First pulse generator 83*

| | | | |
|---|---|---|---|
| Resistor | 146a | ohms | 3,300 |
| Resistor | 147a | do | 10,000 |
| Resistor | 155a | do | 470 |
| Resistor | 151a | do | 3,900,000 |
| Capacitor | 148a | microfarads | .01 |
| Resistor | 162a | ohms | 470 |
| Capacitor | 161a | microfarads | .01 |
| Resistor | 172 | ohms | 470 |

The total current consumption of the impulse counter of Figure 4 amounts to 18 milliamperes only corresponding to a power of approximately 800 milliwatts.

There has thus been disclosed a bistable multivibrator circuit which may be triggered by input pulses of either polarity or of mixed polarity impressed on one electrode only of one of the two semi-conductor devices of the circuit. The multivibrator circuit is more stable in operation than previously known semi-conductor multivibrator circuits. The multivibrator circuit of the invention may be used with advantage in an impulse counter, such as a decade counter.

What I claim is:

1. A bistable multivibrator circuit comprising a first and a second semi-conductor device, each having a semi-conducting body, a base electrode, an emitter electrode and a collector electrode in contact with each body, a source of potential, a first pair of impedance elements, each being connected between one terminal of said source and one of said collector electrodes, a second pair of impedance elements, each being connected between the other terminal of said source and one of said base electrodes, said source being so poled as to apply a reverse bias potential between each collector electrode and its associated base electrode, means for applying a forward bias potential between each emitter electrode and its associated base electrode, a first pair of resistors, each being connected between the base electrode of one of said devices and the collector electrode of the other device to provide regenerative feedback paths and a further coupling impedance element interconnecting said emitter electrodes.

2. A bistable multivibrator circuit comprising a first and a second semi-conductor device, each having a semi-conducting body, a base electrode, an emitter electrode and a collector electrode in contact with each body, a source of potential, a first pair of impedance elements, each being connected between one terminal of said source and one of said collector electrodes, a second pair of impedance elements, each being connected between the other terminal of said source and one of said base electrodes, said source being so poled as to apply a reverse bias potential between each collector electrode and its associated base electrode, means for applying a forward bias potential between each emitter electrode and its associated base electrode, a first pair of resistors, each being connected between the base electrode of one of said devices and the collector electrode of the other device to provide regeneration, and a coupling capacitor connected between said emitter electrodes, means for applying trigger pulses to said first device, and means for deriving output pulses from said second device in response to said trigger pulses.

3. A bistable multivibrator circuit comprising a first and a second semi-conductor device, each having a semi-conducting body, a base electrode, an emitter electrode and a collector electrode in contact with each body, a source of potential, a first pair of resistors, each being connected between one terminal of said source and one of said collector electrodes, a second pair of resistors, each being connected between the other terminal of said source and one of said base electrodes, said source being so poled as to apply a reverse bias potential between each collector electrode and its associated base electrode, means for applying a forward bias potential between each emitter electrode and its associated base electrode, a third pair of resistors, each being connected between the base electrode of one of said devices and the collector electrode of the other device to provide regenerative feedback paths, a coupling impedance element connecting said emitter electrodes, means for applying trigger pulses to said first device, and means for deriving output pulses from said second device.

4. A bistable multivibrator circuit comprising a first and a second semi-conductor device, each having a semi-conducting body, a base electrode, an emitter electrode and a collector electrode in contact with each body, a source of potential, a first pair of resistors, each being connected between one terminal of said source and one of said collector electrodes, a second pair of resistors, each being connected between the other terminal of said source and one of said base electrodes, said source being so poled as to apply a reverse bias potential between each collector electrode and its associated base electrode, means for applying a forward bias potential between each emitter electrode and its associated base electrode, including a third pair of resistors, each being connected in circuit with one of said emitter electrodes, a fourth pair of resistors, each being connected between the base electrode of one of said devices and the collector electrode of the other device to provide regeneration, a coupling capacitor connected between said emitter electrodes, means for applying trigger pulses to the base electrode of said first device, said capacitor facilitating the transfer of said trigger pulses from the base electrode of said first device to said second device, and means for deriving output pulses from said second device.

5. A bistable multivibrator circuit comprising a first and a second semi-conductor device, each having a semi-conducting body, a base electrode, an emitter electrode and a collector electrode in contact with each body, a source of potential, a first pair of resistors, each being connected between one terminal of said source and one of said collector electrodes, a second pair of resistors, each being connected between the other terminal of said source and one of said base electrodes, said source being so poled as to apply a reverse bias potential between each collector electrode and its associated base electrode, means for applying a forward bias potential between each emitter electrode and its associated base electrode including a third pair of resistors, each being connected in circuit with one of said emtiter electrodes, a fourth pair of resistors, each being connected between the base electrode of one of said devices and the collector-electrode of the other device, a coupling capacitor connected between said emitter electrodes, means for applying trigger pulses to the base electrode of said first device, and means for deriving output pulses from the collector electrode of said second device, said capacitor and the resistor connected in circuit with the emitter electrode of said second device having such values as to function as a differentiating network for impulses developed at the emitter electrode of said first device in response to said trigger pulses, and the resistance of the resistor connected in circuit with the emitter electrode of said first device being larger than that of the resistor connected in circuit with the emitter electrode of said second device.

6. A bistable multivibrator circuit comprising a first and a second semi-conductor device, each having a semi-conducting body, a base electrode, an emitter electrode and a collector electrode in contact with each body, a source of potential, a first pair of resistors, each being connected between one terminal of said source and one of said collector electrodes, a second pair of resistors, each being connected between the other terminal of said source and one of said base electrodes, said source being so poled as to apply a reverse bias potential between each collector electrode and its associated base electrode, means for applying a forward bias potential between each emitter electrode and its associated base electrode including a third pair of resistors, each being connected in circuit with one of said emitter electrodes, a fourth pair of resistors, each being connected between the base electrode of one of said devices and the collector electrode of the other device, a coupling capacitor connected between said emitter electrodes, means for applying trigger pulses to the base electrode of said first device, and means for deriving output pulses from the collector electrode of said second device, the resistance of the resistor connected to the base electrode of said first device being larger than the resistance of the resistor connected to the base electrode of said second device, and the resistance of the resistor connected between the base electrode of said first device and the collector electrode of said second device being smaller than the resistance of the resistor connected between the base electrode of said second device and the collector electrode of said first device, thereby to facilitate the transfer of said trigger pulses from the base electrode of said first device to the collector electrode of said second device.

7. In an electronic impulse counter, a counter stage including a bistable multivibrator circuit comprising a first and a second semi-conductor device, each having a semi-conducting body, a base electrode, an emitter electrode and a collector electrode in contact with each body, a source of potential, a first pair of resistors, each being connected between one terminal of said source and one of said collector electrodes, a second pair of resistors, each being connected between the other terminal of said source and one of said base electrodes, said source being so poled as to apply a reverse bias potential between each collector electrode and its associated base electrode, a third pair of resistors, each having one terminal connected to one of said emitter electrodes, a further resistor connected between the other terminals of said third pair of resistors and said other terminal of said source, a first capacitor connected in shunt with said further resistor, a fourth pair of resistors, each being connected between the base electrode of one of said devices and the collector electrode of the other device, a second coupling capacitor connected between said emitter electrodes, means for applying trigger pulses to the base electrode of said first device, and means including a differentiating network and a clipper for deriving output pulses from the collector electrode of said second device and for impressing said output pulses on a succeeding counter stage.

RAYMOND P. MOORE, Jr.

No references cited.